United States Patent [19]

Huang

[11] Patent Number: 5,899,722

[45] Date of Patent: May 4, 1999

[54] METHOD OF FORMING DUAL SPACER FOR SELF ALIGNED CONTACT INTEGRATION

[75] Inventor: Jenn Ming Huang, Hsin-Chu, Taiwan

[73] Assignee: Taiwan Semiconductor Manufacturing Company Ltd., Hsin-Chu, Taiwan

[21] Appl. No.: 09/083,417

[22] Filed: May 22, 1998

[51] Int. Cl.[6] .................................................. H01L 21/336
[52] U.S. Cl. ..................... 438/305; 438/303; 438/266; 438/637
[58] Field of Search ..................................... 257/344, 388; 438/257, 258, 264, 303, 305, 307, 355, 637

[56] References Cited

U.S. PATENT DOCUMENTS

| | | | |
|---|---|---|---|
| 4,912,061 | 3/1990 | Nasr | 437/44 |
| 5,208,472 | 5/1993 | Su et al. | 257/344 |
| 5,418,392 | 5/1995 | Tanabe | 257/388 |
| 5,494,838 | 2/1996 | Chang et al. | 437/43 |
| 5,747,373 | 5/1998 | Yu | 438/305 |
| 5,763,312 | 6/1998 | Jeng et al. | 438/637 |

*Primary Examiner*—Charles L. Bowers
*Assistant Examiner*—Jack Chen
*Attorney, Agent, or Firm*—George O. Saile; Stephen B. Ackerman

[57] ABSTRACT

In this invention two side wall spacers are applied to the vertical structure of a gate. The first spacer made of $Si_3N_4$ provides for SAC (self aligned contact) definition and the second spacer made of $SiO_2$ is used for the definition of the LDD (lightly doped drain). The second spacer is the outer spacer and is anisotropically etched when the IPO (inter-poly-oxide) is etched to open a SAC contact area for second level polysilicon deposition. This allows a spacer width for the desired length of the LDD while providing a wider width for SAC contact. The SAC contact is not limited by the LDD spacer and the LDD spacer can be optimized without considering the SAC requirements. This invention is easily applied to SRAMS and DRAMS without extra masking.

7 Claims, 5 Drawing Sheets

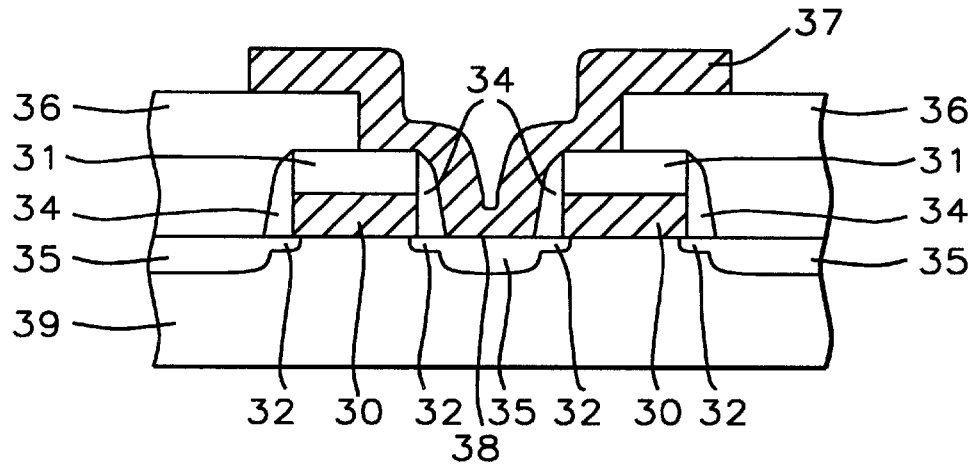
FIG. 1a – Prior Art
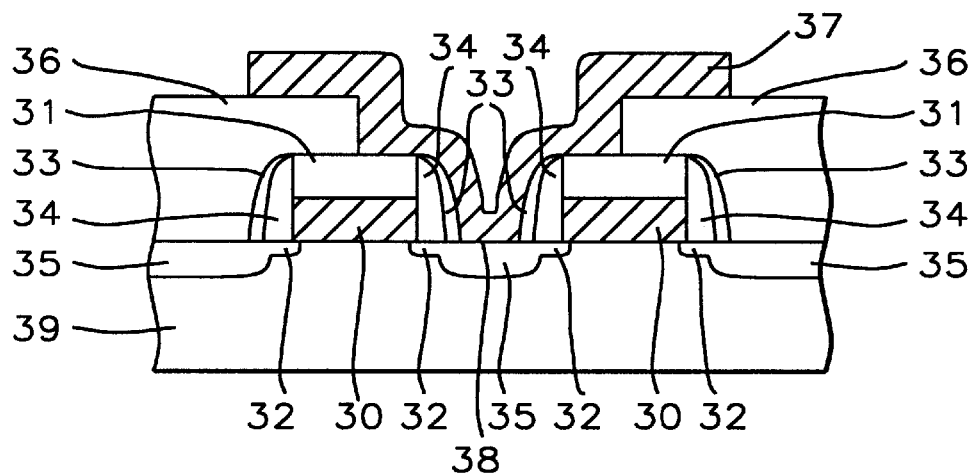
FIG. 1b – Prior Art
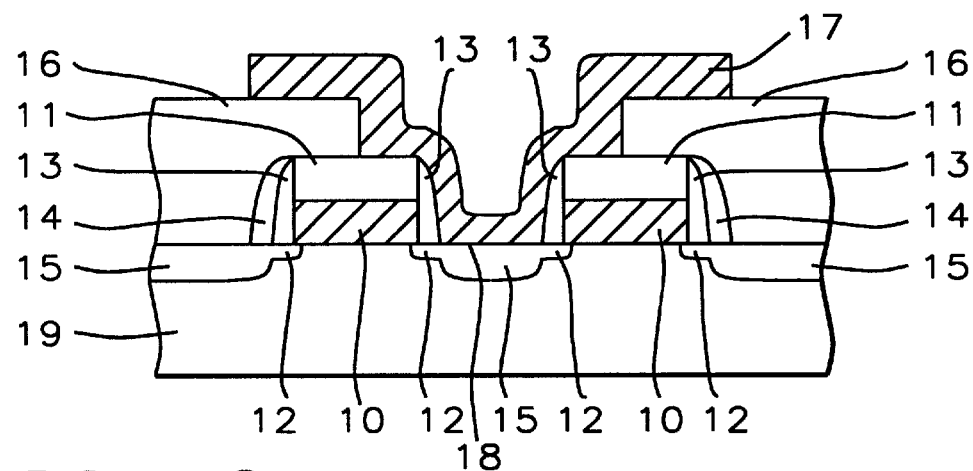
FIG. 2

5,899,722

METHOD OF FORMING DUAL SPACER FOR SELF ALIGNED CONTACT INTEGRATION

BACKGROUND OF THE INVENTION

1. Field of Invention

This invention relates to processing of semiconductor devices and in particular double side wall spacers for lightly doped drain (LDD) and self aligned contact (SAC) definition.

2. Description of Related Art

The self aligned contact (SAC) is a powerful method used in semiconductor manufacturing to reduce chip size by shortening the separation of contact to polysilicon. This is especially true in memory products. The space used for lightly doped drain (LDD) limits the smallest size possible with SAC. Creation of a double spacer helps alleviate the conflict between LDD and SAC requirements.

In U.S. Pat. No. 5,494,838 (Chang et al.) a floating gate is created as a side wall spacer and incorporates spacer fabrication techniques to achieve a high density nonvolatile memory cell having a split gate configuration. Referring to U.S. Pat. No. 5,468,665 (Lee et al.), a process is described in which an LDD MOSFET is formed without using a side wall spacer as an ion implantation inhibiting layer in order to produce high density semiconductor devices. In U.S. Pat. No. 5,208,472 (Su et al.) a method of forming a SAC structure is described where a first side wall is used to define a LDD structure, and a second side wall is used to extend the oxide region at the gate edge and improve source/drain leakage property. In U.S. Pat. No. 4,912,061 (Nasr) a method is described for fabricating a self aligned metal oxide semiconductor device using a disposable silicon nitride spacer.

The use of spacers are important in forming SAC structures and protecting LDD near a gate which can lead to higher densities and smaller chips; however, there is a limit to which the density can be increased, particularly when the LDD and SAC requirements are in conflict. It is, therefore, the purpose of this invention to teach a means by which spacers can be used without the conflicting requirements of the lightly doped drain and the self aligned contact.

SUMMARY OF THE INVENTION

In this invention a transistor gate is defined by a silicon nitride ($Si_3N_4$) insulator on top of a first polysilicon layer. An LDD is implanted into the wafer substrate containing the transistor gate, and $Si_3N_4$ is deposited over the surface of the wafer by low pressure chemical vapor deposition. The $Si_3N_4$ is etched anisotropically to form a first spacer side wall on the gate structure. After the first spacer has been formed, silicon oxide ($SiO_2$) is deposited on the surface of the wafer. The $SiO_2$ is etched to form a second spacer covering the first spacer on the side wall of the gate structure and exposing the source and drain surfaces beyond the second spacer. The source and drain are ion implanted to become $N^+$ or $P^+$ material depending on the type transistor that is being constructed. An IPO (inter-poly-oxide) is deposited over the surface of the wafer and a photoresist is applied to the surface of the IPO. Exposed areas of the photoresist are opened over contact areas, SAC, of the source and drain that are to receive a second level of polysilicon. The IPO is etched including the second spacer made of $SiO_2$ exposing the SAC of the drain or the source up to the first spacer made of $Si_3N_4$. This provides a wider SAC area than could be otherwise obtained with both the first and second spacer left in tact. After etching the oxide, a second layer of polysilicon is deposited over the surface of the wafer. Photoresist is applied and exposed areas which exclude the source and drain contact areas are etched leaving a second level polysilicon contacting the source and drain contact areas.

In the event that ion implantation is required after the first $Si_3N_4$ spacer with a first set of SAC areas as with some memory products, a photoresist and ion implantation step can be inserted after the first spacer has been formed to ion implant the first set of SAC areas. Once ion implantation has been completed on the first set of SAC areas, then layer of $SiO_2$ is formed over the surface of the wafer. The $SiO_2$ is etched to form a second spacer covering the first spacer. A second photoresist is then applied to block the first set of SAC areas from ion implantation and to allow a second set of SAC areas to receive ion implantation. Next an IPO is deposited over the surface of the wafer and a photoresist is applied to the surface of the IPO. Exposed areas of the photoresist are opened over the SAC of the source and drain that are to receive a second level of polysilicon. The IPO is etched including the second spacer made of SiO2 exposing the SAC of the drain or the source up to the first spacer made of $Si_3N_4$. This provides a wider SAC area than could be otherwise obtained with both the first and second spacer left in tact. After etching the oxide, a second layer of polysilicon is deposited over the surface of the wafer. Photoresist is applied and exposed areas which exclude the source and drain contact areas are etched leaving a second level polysilicon in contact with source and drain contact areas.

This invention allows a narrow spacer for the SAC area and a wider spacer for LDD. The SAC contact area does not limit the LDD spacer and the LDD spacer can be optimized without considering the SAC contact. The SAC contact can be shrunk without impacting the transistor and the technique is easily applied to either SRAM's or DRAM's.

BRIEF DESCRIPTION OF THE DRAWINGS

This invention will be described with reference to the accompanying drawings, wherein:

FIG. 1a is a cross-section diagram of prior art device with one side wall spacer;

FIG. 1b is a cross-section diagram of prior art device with two side wall spacers;

FIG. 2 is a cross-section diagram of the final structure of this invention showing a SAC with a level two of polysilicon;

DETAILED DESCRIPTION OF THE PREFERRED EMBODIMENT

Figure 3A:
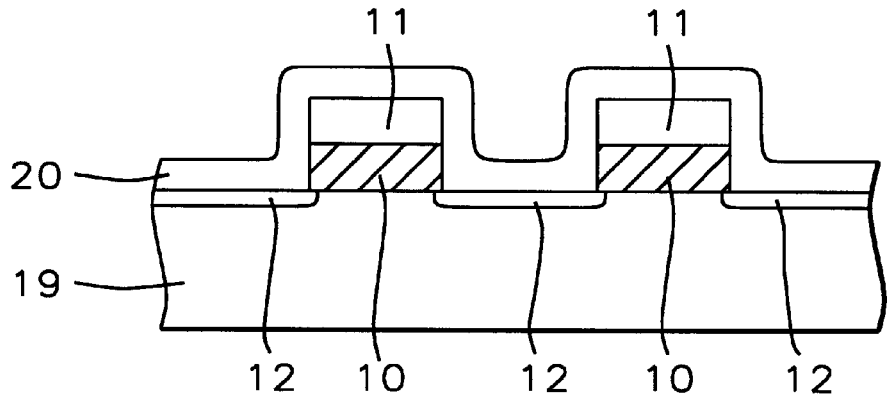
FIGS. 3a–3f are a cross-section representation of a first embodiment of this invention in which a double spacer is implemented to define separately an LDD and a SAC.

In the discussion that follows, several figures of a cross section of an MOS structure will be referenced. Each of these figures will contain similar shapes and same reference numbers so that the differences between the structures from figure to figure can easily be followed.

In FIG. 1a is shown a cross section diagram of prior art of an MOS structure on a semiconductor substrate 39. A self aligned contact (SAC) 38 with a second level of polysilicon 37 is interposed between two gate structures. The gate structures consist of a first level polysilicon 30 covered with a layer of silicon nitride 31 and having a side wall spacer of silicon oxide 34. Underlying the gate structure and the SAC 38 is an LDD 32 and an ion implanted source/drain 35. An IPO 36 has been anisotropically etched around the SAC area 38 and a second level of polysilicon 37 has been deposited. The SAC contact area 38 as shown is too narrow to permit a reliable contact.

In FIG. 1b is shown a second cross section of prior art. This cross section is identical to that of FIG. 1a with the exception that a second side wall spacer 33 made of silicon nitride is formed over the first side wall spacer 34. The first side wall spacer 34 made of SiO2 is for forming the lightly doped drain (LDD) 32 and the second side wall spacer 33 made of $Si_3N_4$ is to form a SAC contact area 38. The SAC contact area 38 as shown is too narrow to permit a reliable contact with the second level polysilicon 37.

Shown in FIG. 2 is a cross section of a final structure of this invention. Here two gate structures are shown having a first level of polysilicon 10 covered with a layer of silicon nitride 11. Underlying the gate structure and a SAC contact area 18 is an LDD 12 and an ion implanted source/drain 15. The gate structure has a first side wall 13 of $Si_3N_4$ and a second side wall 14 of $SiO_2$. Notice that the spacer 13 adjacent to the gate structure is made of $Si_3N_4$ and the outer spacer 14 is made of $SiO_2$. This relationship of the spacers to the gate structure is the reverse of that shown in FIG. 1b where the closer spacer 14 is of $SiO_2$ and the outer spacer 13 is of $Si_3N_4$.

Continuing to refer to FIG. 2, in the SAC contact region 18 the outer spacer 14 is anisotropically etched with the etching of the IPO 16 to open up the SAC. A second level of polysilicon 17 is deposited onto the SAC. With the etching away of the outer spacer 14 along with the IPO 16 around the SAC area 18, a much broader contact area 18 is created, and allows a more reliable contact area 18 at a narrow dimension.

Figure 3B:
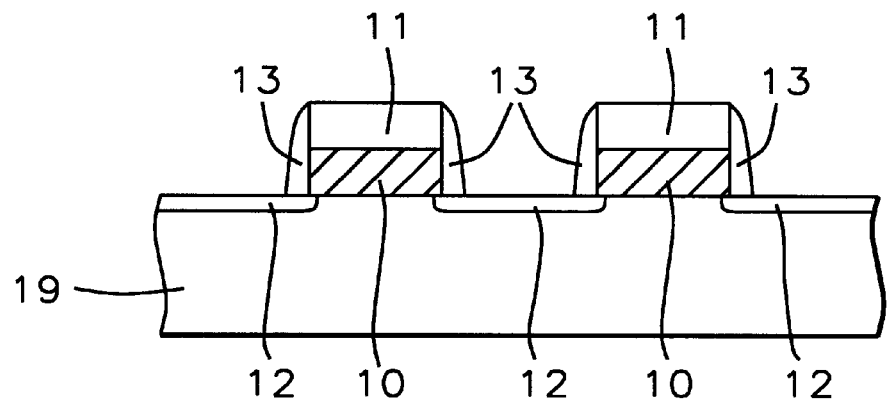

In FIG. 3a through FIG. 3f is shown a series of cross sections of a MOS structure that demonstrate a method of a first embodiment of this invention. Referring to FIG. 3a, a gate structure beside another gate structure is shown on a semiconductor substrate 19. The gates are constructed of a first layer of polysilicon 10 covered by an insulating layer 11 made of $Si_3N_4$. Underlying the edge of the gates is a lightly doped drain (LDD)) 12. A layer 20 of silicon nitride, $Si_3N_4$, is deposited over the surface of the wafer 19 by, for example, low pressure chemical vapor deposition (LPCVD) to a thickness of between about 600–1000 angstroms. In FIG. 3b the layer 20 of $Si_3N_4$ is anisotropically etched leaving a first side wall 13 made of $Si_3N_4$. This first side wall 13 extends from the $Si_3N_4$ cover 11 of the gate to the surface of the wafer 19 including the first layer of polysilicon 10 and covers the LDD 12 near the gate structure.

Figure 3C:
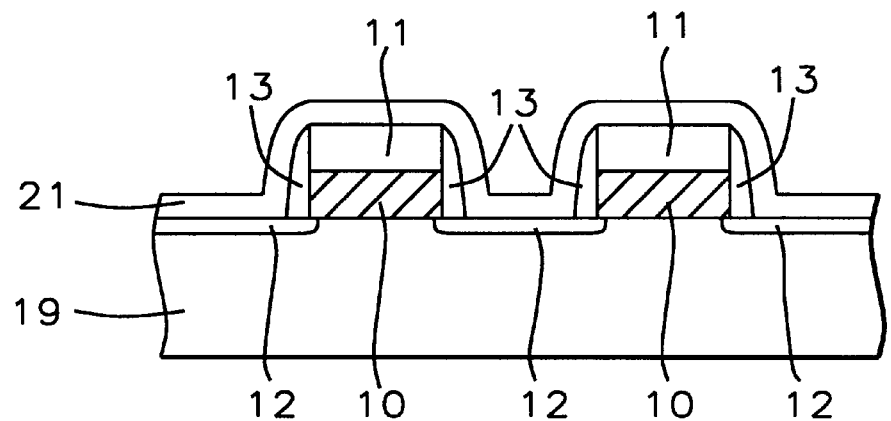
Figure 3D:
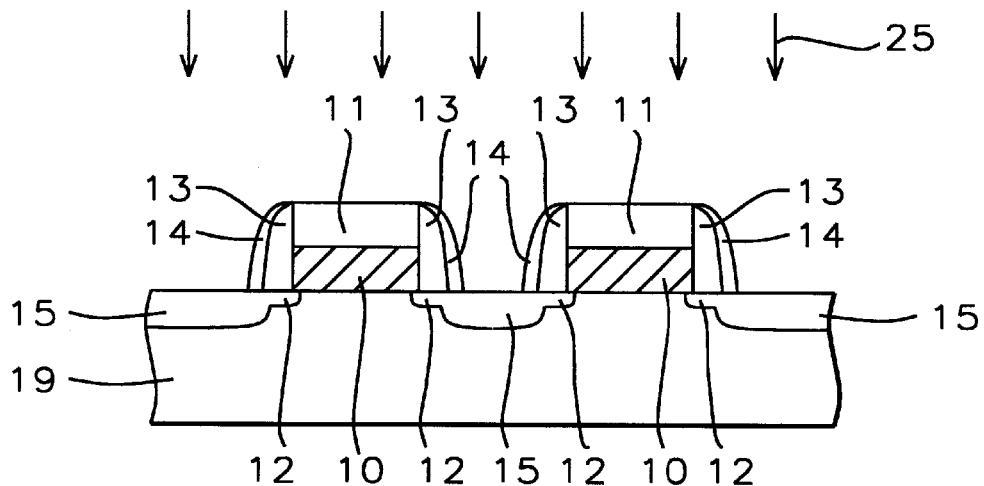
Figure 3E:
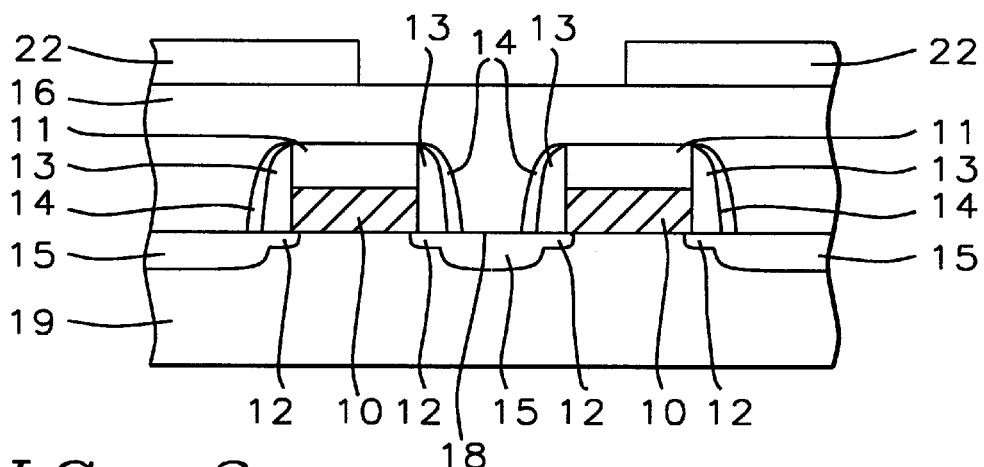

In FIG. 3c a layer 21 of $SiO_2$ is deposited by, for example, LPCVD to a thickness of between about 600–1000 A over the surface of the wafer 19 and covering the $Si_3N_4$ gate insulator 11 and the first side wall 13. The layer 21 of $SiO_2$ is anisotropically etched in FIG. 3d leaving a second side wall 14 of $SiO_2$ covering the first side wall 13 and exposing the surface of the gate insulator 11. After the second side wall 14 has been formed, the heavily doped source and drain regions 15 are ion implanted 25 using the side wall spacers 13 and 14 as masks and leaving a portion of the LDD 12 in the wafer substrate 19 under the first spacer 13. Then a planar layer of IPO 16 is formed over the surface of the wafer 19 as shown in FIG. 3e. Continuing to refer to FIG. 3e, a layer of photoresist 22 is applied and an opening is made in the photoresist over a SAC region 18.

Figure 3F:
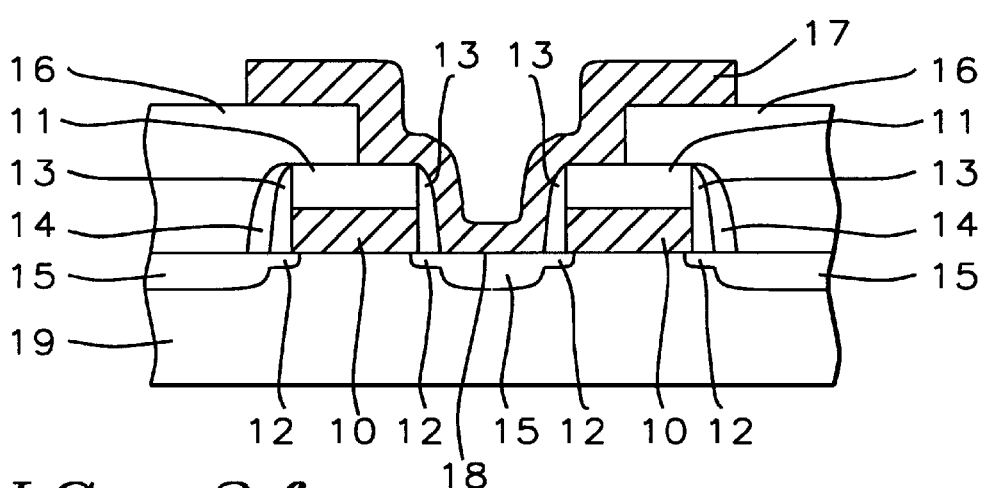

Referring to FIG. 3f, the IPO 16 is anisotropically etched around the SAC area 18 and the $SiO_2$ spacer 14 is removed in the vicinity of the SAC 18. Thus a wide contact area 18 is formed to deposit a second layer of polysilicon 17, enhancing the reliability of the contact, allowing smaller dimensions and higher circuit density.

Shown in FIG. 3f is a cross section of a final structure of this invention. Two gate structures are shown on a wafer substrate 19 having a first level of polysilicon 10 covered with a layer of silicon nitride 11. Underlying the gate structure and a SAC contact area 18 is an LDD 12 and an ion implanted heavily doped source/drain 15. The gate structure has a first side wall 13 of $Si_3N_4$ and a second side wall 14 of $SiO_2$. The spacer 13 adjacent to the gate structure is made of $Si_3N_4$ and the outer spacer 14 is made of $SiO_2$. In the SAC contact region 18 the outer spacer 14 is anisotropically etched with the etching of the IPO 16 to open up the SAC contact region 18. A second level of polysilicon 17 is deposited onto the SAC. With the etching of the outer spacer 14 along with the IPO 16 around the SAC area 18, a much broader contact area 18 is created, allowing a more reliable contact at a narrow dimension.

Figure 4A:
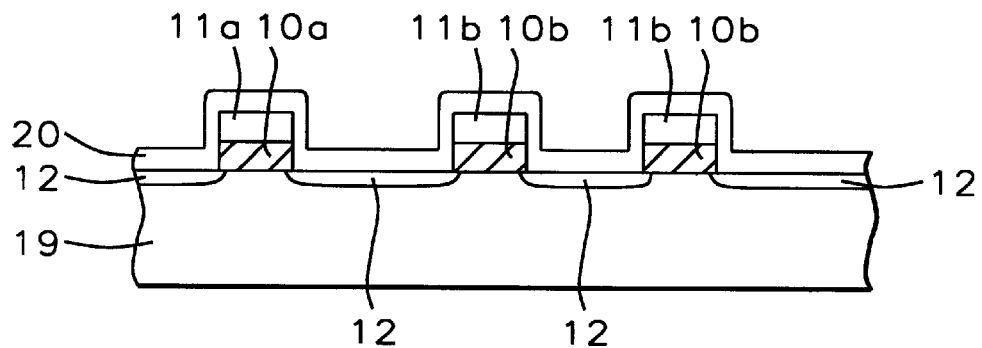
FIGS. 4a–4f are a cross-section representation of a second embodiment of this invention in which a double spacer is implemented to define separately an LDD and a SAC.

In FIG. 4a through FIG. 4f is shown a variation of the process shown previously in FIGS. 3a through 3f. Referring to FIG. 4a, there are three gate structures shown. A first gate structure is shown comprising a first layer of polysilicon 10a and an overlaying insulation 11a of $Si_3N_4$. A second set of gates are shown comprising a first layer of polysilicon 10b and an overlaying insulation 11b of $Si_3N_4$. There is no difference in the gate structures other than to help differentiate between the first set and the second set. Underlying the gate structures is an LDD 12, and deposited on the surface of the wafer 19 including the gate structures is a layer 20 of $Si_3N_4$ insulator.

Figure 4B:
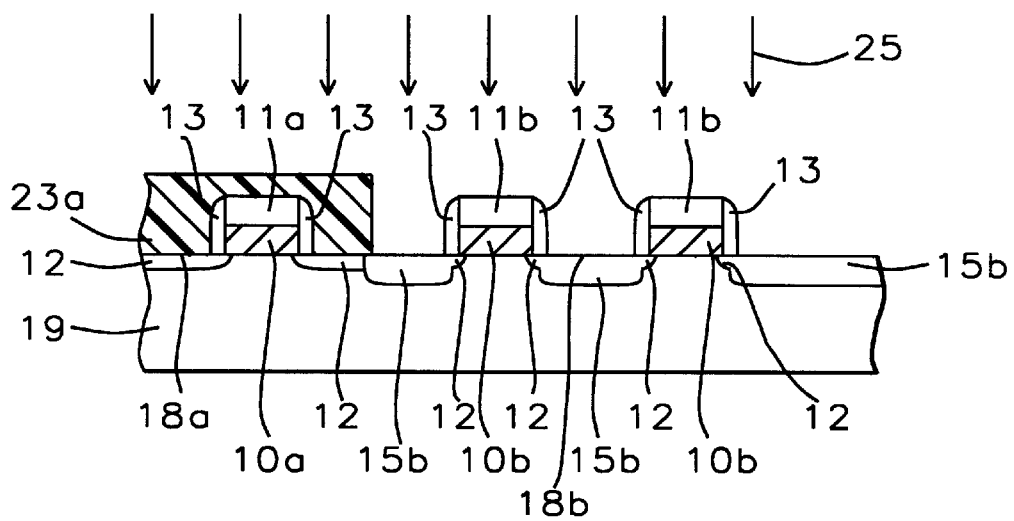
Figure 4C:
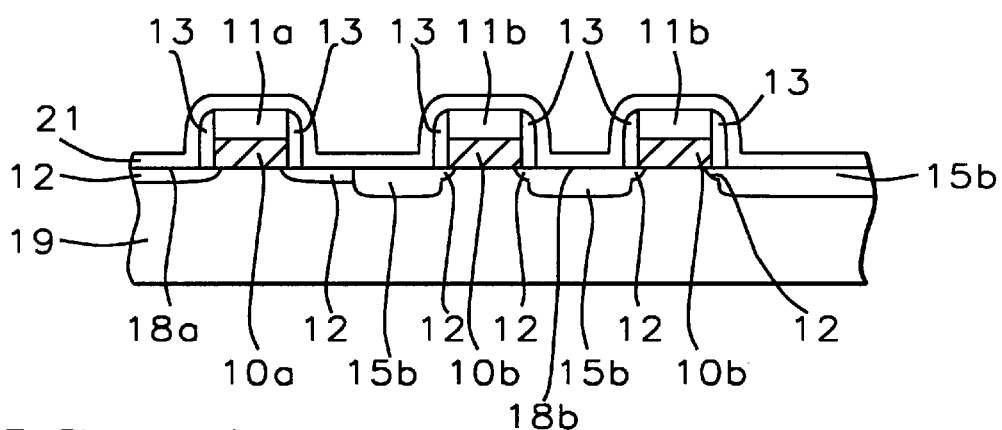

In FIG. 4b the $Si_3N_4$ insulator 20 is anisotropically etched to produce a side wall spacer 13 covering a portion of the LDD 12 nearest the first layer of polysilicon 10a and 10b. A first set of SAC areas 18a, associated with gate structure 10a and 11a, are masked off by a photoresist 23a providing an alternate structure to maintain lightly doped drain/source regions for memory cell locations. The second set of SAC areas 18b, associated with gate structure 10b and 11b for non-memory cell locations, are ion implanted 25 to produce a heavily doped source and drain region 15b. The photoresist is removed from the wafer and in FIG. 4c a layer of $SiO_2$ insulation 21 is formed over the wafer 19 including the gates and the first side wall spacer 13.

Figure 4D:
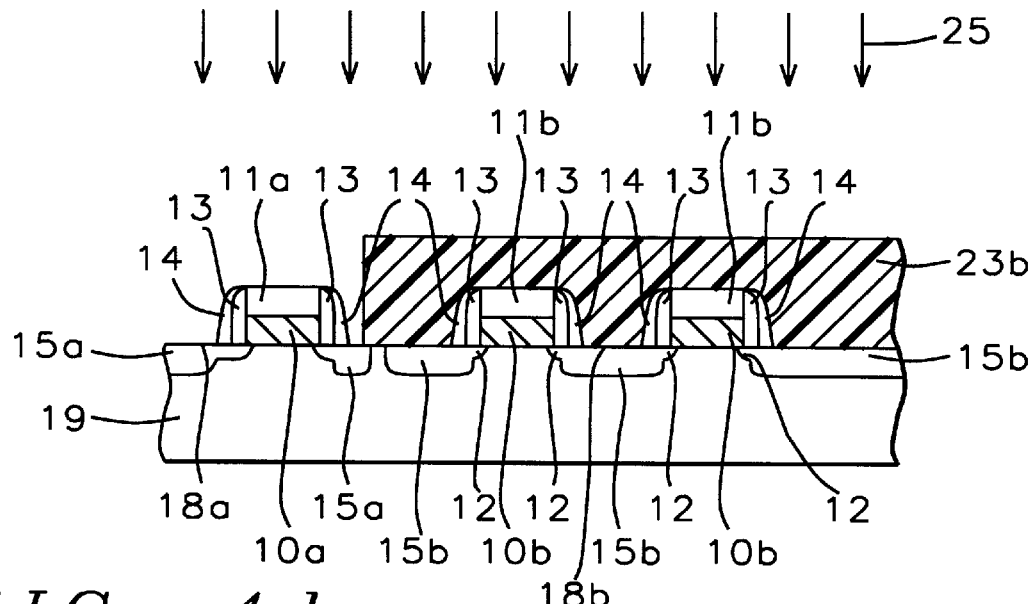

Referring to FIG. 4d, the $SiO_2$ insulator 21 is anisotropically etched until only a second side wall spacer 14 is left covering the first spacer 13. Then photoresist 23b is applied to the wafer surface 19 including all the gate structures. An opening in the photoresist is formed, and the first set SAC areas 18a are ion implanted 25 to form heavily doped source and drain areas 15a.

Figure 4E:
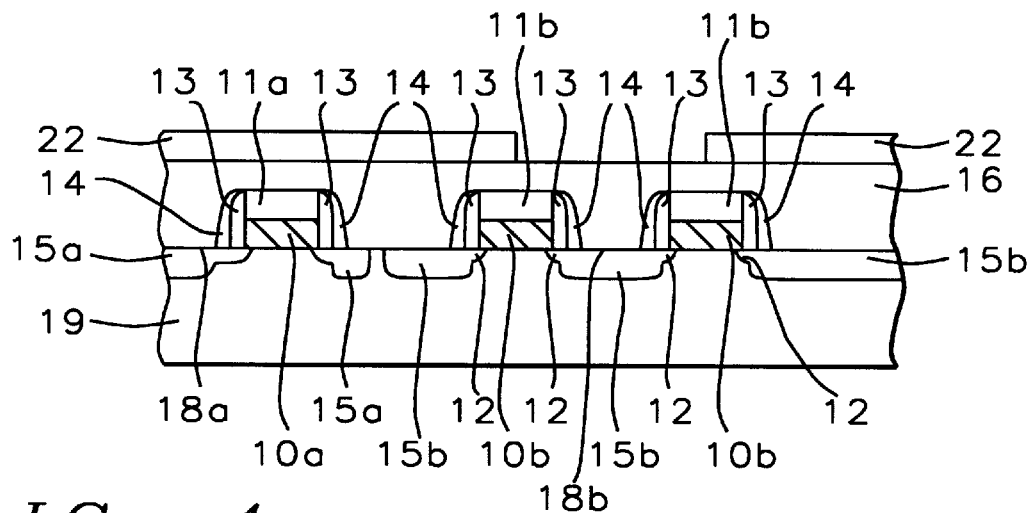
Figure 4F:
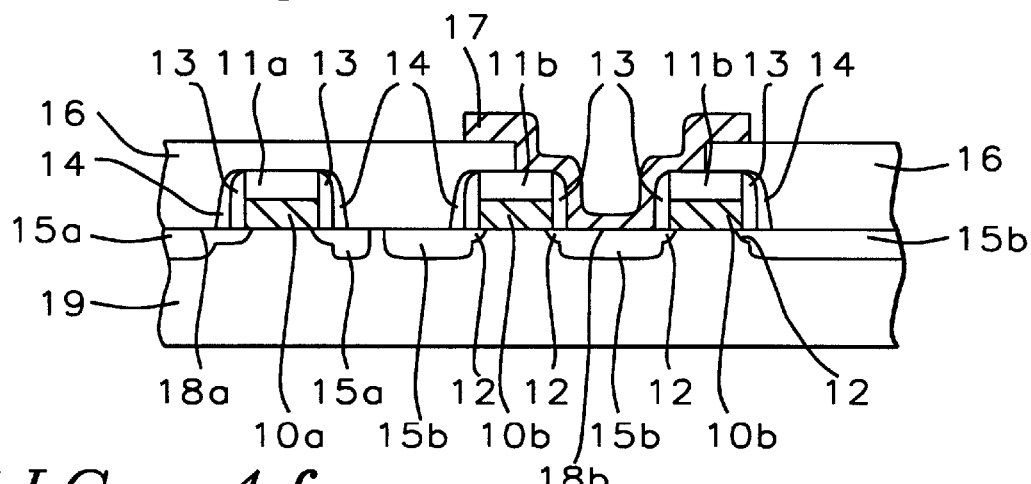

In FIG. 4e a coating of IPO 16 is formed over the wafer 19, and on top of the IPO 16 a photoresist 22 is applied. An opening in the photoresist is formed over SAC area 18b. This opening in the photoresist could have been over a SAC area 18a. The IPO 16 including the $SiO_2$ of the second side wall spacer 14 is anisotropically etched as shown in FIG. 4f, eliminating the second side wall spacer 14 in the vicinity of the SAC opening. This provides a broad surface 18b to which to apply the second layer of polysilicon 17. The same broad SAC contact area can occur with the first set of SAC areas 18a. The difference between the 18a and 18b contact areas is found in the remaining length of the LDD 12 associated with the first set of SAC areas 18a compared to the length of LDD 12 associated with the second set of SAC areas 18b.

Shown in FIG. 4f is a cross section of a final structure of this invention. A first gate structure is shown on a wafer substrate 19 having a first level of polysilicon 10a covered with a layer of silicon nitride 11a, and a second gate structure is shown with two gates being depicted each having a first level of polysilicon 10b covered with a layer of silicon nitride 11b. Underlying the gate structure and a SAC contact area 18a and 18b is an LDD 12 with an ion implanted heavily doped source/drain 15a and 15b. The gate structures has a first side wall 13 of $Si_3N_4$ and a second side wall 14 of $SiO_2$. In the SAC contact region 18b the outer spacer 14 is anisotropically etched along with the etching of the IPO 16 to open up the SAC and expose the first side wall 13 to the SAC contact region 18b. A second level of polysilicon 17 is deposited onto the SAC. With the etching of the outer spacer 14 along with the IPO 16 around the SAC area 18b, a much broader contact area 18b is created, allowing a more reliable contact area 18b at a narrow dimension. This same wide contact area can be obtained in a contact region 18a associated with the first set of gates represented by a first layer of polysilicon 10a and the covering $Si_3N_4$ insulation 11a.

The lightly doped drain regions of the invention could be formed of an $N^-$ implant, with the heavily doped regions formed of an $N^-$ implant and using a P-doped substrate. Similarly, the lightly doped drain regions of the invention could be formed of a $P^-$ implant, with the heavily doped regions formed of an $P^-$ implant and using an N-doped substrate.

While the invention has been particularly shown and described with reference to preferred embodiments thereof, it will be understood by those skilled in the art that various changes in form and details may be made without departing from the spirit and scope of the invention.

What is claimed is:

1. A method of forming dual sidewall spacers for a semiconductor device, wherein some transistors have a shorter lightly doped drain, comprising the steps of:

a) forming a plurality of transistor gates on a semiconductor substrate, wherein each of the gates comprises a silicon nitride insulator above a polysilicon gate electrode, b) ion implanting said semiconductor substrate using said gates as a mask to form lightly doped drain regions, c) forming silicon nitride spacers on the sidewalls of each gate, d) forming heavily doped first drain and first source regions in a non-memory region in said substrate using the silicon nitride spacer as a mask, e) forming silicon oxide spacers over said silicon nitride spacers, f) forming heavily doped second drain and second source regions in a memory region in said substrate using said silicon oxide spacers as a mask, g) depositing an interpoly oxide layer over said substrate, h) forming opening in said interpoly oxide layer in said non-memory region, exposing gate sidewall spacers, i) removing said silicon oxide spacers from within said opening j) forming a self aligned contact in said opening.

2. The method of claim 1, wherein forming said silicon nitride spacers comprises the steps of:

a) depositing a layer of silicon nitride over said gates and said substrate by low pressure chemical vapor deposition to a thickness of between about 600 and 1000 Angstroms, b) anisotropically etching said silicon nitride to form said silicon nitride spacers.

3. The method of claim 1, wherein forming said silicon oxide spacers comprises the steps of:

a) depositing a layer of silicon oxide over said gates and said substrate by low pressure chemical vapor deposition to a thickness of between about 600 and 1000 Angstroms, b) anisotropically etching said silicon oxide to form said silicon oxide spacers over said silicon nitride spacers.

4. The method of claim 1, wherein ion implanting forms $P^-$ lightly doped drain regions, and forming heavily doped first and second drain and source regions is done with a $P^+$ implant on an N substrate.

5. The method of claim 1, wherein ion implanting forms $N^-$ lightly doped drain regions, and forming heavily doped first and second drain and source regions is done with an $N^+$ implant on a P substrate.

6. The method of claim 1, wherein forming heavily doped source and drain regions can be done before forming said silicon oxide spacers over said silicon nitride spacers.

7. The method of claim 1, wherein forming said silicon oxide spacer protects the region and optimizes said transistor independent of the self aligned contact and forming the silicon nitride spacer optimizes said self aligned contact independent of said transistor.

* * * * *